US006781122B2

(12) United States Patent
Colburn et al.

(10) Patent No.: US 6,781,122 B2
(45) Date of Patent: Aug. 24, 2004

(54) TIME OF FLIGHT MASS SPECTROMETRY APPARATUS

(75) Inventors: Alexander William Colburn, Coventry (GB); Peter John Derrick, Ladbroke (GB); Anastassios Giannakopulos, Keynes (GB)

(73) Assignee: University of Warwick, Coventry (GB)

( * ) Notice: Subject to any disclaimer, the term of this patent is extended or adjusted under 35 U.S.C. 154(b) by 0 days.

(21) Appl. No.: 10/221,378

(22) PCT Filed: Mar. 13, 2001

(86) PCT No.: PCT/GB01/01101

§ 371 (c)(1), (2), (4) Date: Nov. 25, 2002

(87) PCT Pub. No.: WO01/69648

PCT Pub. Date: Sep. 20, 2001

(65) Prior Publication Data

US 2003/0183758 A1 Oct. 2, 2003

(30) Foreign Application Priority Data

Mar. 13, 2000 (GB) ............................................. 0006046

(51) Int. Cl.[7] ............................................. H01L 49/40
(52) U.S. Cl. ....................................... 250/287; 250/282
(58) Field of Search ................................. 250/287, 282

(56) References Cited

U.S. PATENT DOCUMENTS 4,818,862 A * 4/1989 Conzemius ................. 250/287
5,464,985 A * 11/1995 Cornish et al. ............. 250/287
5,814,813 A * 9/1998 Cotter et al. ................ 250/287
6,204,500 B1 * 3/2001 Whitehouse et al. ....... 250/287
6,489,610 B1 * 12/2002 Barofsky et al. ........... 250/287

* cited by examiner

*Primary Examiner*—John R. Lee
*Assistant Examiner*—James J. Leybourne
(74) *Attorney, Agent, or Firm*—Wood, Phillips, Katz, Clark & Mortimer

(57) ABSTRACT

Mass spectrometry apparatus 105 comprises a serial arrangement of an ion source 110, first time of flight means, a field free region 120, means to fragment the molecules, a second time of flight means and a large area detector 160 The second time of flight means includes an ion mirror 150, the ion mirror 150 being arranged to produce a reflecting substantially quadratic field. The first time of flight means is arranged to provide spatial focusing concomitant with time focusing of ions at or near the entrance to the ion mirror 150. The means provided to fragment the ions from the first time of flight means can be a collision cell 140 or in the field free region 220 or in the first time of flight means. The means to fragment the molecules has a potential which is different from the potential at the entrance to the ion mirror 150, and the detecting surface of the detector 160 is mounted in the time focal surface of the ion mirror 150.

20 Claims, 8 Drawing Sheets

TIME OF FLIGHT MASS SPECTROMETRY APPARATUS

The invention relates to time of flight mass spectrometry apparatus.

There are growing needs in biological fields for the characterisation of biomolecules available in minute quantities (picomolar, femtomolar, attomolar levels), and in general for structural characterisation of macromolecules including polymers.

Peptides formed by enzymatic digestion of proteins constitute one example in the field of proteomics. Analyses of synthetic polymers constitute a related challenge, although here the constraint of limited availability of sample is normally less relevant. The ionisation method of matrix-assisted laser desorption/ionisation (MALDI) in combination with time-of-flight (TOF) analysers has become one of the standard approaches to characterisation by mass spectrometry of non-volatile, thermally labile substances such as peptides, proteins and polymers. Electrospray ionisation (ESI) is the other method of ionisation of importance for TOF mass spectrometry of peptides, proteins, polymers and other non-volatile, thermally labile substances.

Established methods combine MALDI with electrostatic ion mirrors, incorporating either one homogeneous reflecting field (one-stage) or two homogeneous reflecting fields (two-stage). The optical axis of an ion mirror may be either approximately in line with or approximately normal (orthogonal) to that of the ion source. These mirrors afford limited capability for compensation of differing ion energies. An intermediate time-focus has been proposed as being advantageous creating effectively a tandom mass spectrometer, and the time-focus being a position for the location of an ion-dissociation cell. MALDI has been combined with so called curved-field ion mirrors and gradient field ion mirrors in which the potential gradient changes steadily with distance. These mirrors have been found to give modest resolution. High resolution could in principle be achieved in a combination of a quadratic field and laser desorption source through restricting ions entering the field to near-zero angles in order to conform to the one-dimensional approximation. The problem, which has been long recognised, is that there are transverse forces because the potential distribution is a saddleback. The sensitivity of such a device is too low to be practical for biological and other application, although adequate for measurement of atoms and small molecules in space research where sample consumption is not an issue.

According to the invention there is provided apparatus for the structural characterisation of large molecules by time-of-flight mass spectrometry, the apparatus comprising an ion source, bunching means, an ion mirror and a large area detector, wherein the ion mirror is arranged to produce a reflecting field, the bunching means is arranged to compress or bunch ions to provide spatial focusing concomitant with time focusing of ions at or near the entrance to the ion mirror, and the detecting surface of the detector is mounted in the focal surface of the ion mirror.

The ion mirror may be arranged to produce a substantially quadratic field. The quadratic nature of the field is required if entering ions possess a range of translational energies, but other suitable fields could be employed in the case of ions formed in the ion source prior to significant acceleration and with near-common translational energies.

There is also provided a method for the structural characterisation of large molecules (masses typically in the range 10 to $10^4$ Da) by time-of-flight mass spectrometry at high-sensitivity and high-resolution by means of the combination of an ion mirror characterised by a quadratic field (including the parabolic case), or substantially quadratic field, ionisation of sample by laser desorption or electrospray ionisation and ion bunching (including time-lag focusing which is also known as "delayed extraction" or "delayed acceleration") to provide concomitant time-focussing and space-focussing at or near to the entrance of the ion mirror either of a single parent mass (specifically m/z) or of a significant number of masses composing the parent and fragment ions formed therefrom by dissociation in a field free region. These fragment ions share a common time-focus with their parent ion. The time and space focus acts as the object of the ion optical system that is the ion mirror leading to a time-focus on an image focal surface characteristic of the mirror and independent of the ion energy. The aforementioned-fragment ions and their parent ions are time-resolved and their time-foci are characteristic of their masses (specifically m/z). A large area detector is placed in this focal surface.

Thus the invention includes the combination of ion bunching, for example, time-lag focusing in a MALDI source. biomolecules and other molecules with masses often of the order of $10^3$ Da and almost always in the range $10^2$ Da to $10^4$ Da and ion mirrors with substantially quadratic fields. Such heavy ions are formed by MALDI with initial velocities close to 1000 $ms^{-1}$, and his initial velocity is not critically dependent upon mass over the mass range in question (few hundred Da to a few tens of thousands of Da). MALDI contrasts with other methods of laser desorption and other methods of ionisation where ions possess common initial kinetic energies. Thus the ions formed by MALDI constitute beams comparable in regard to common velocity to supersonic molecular beams, and in this regard MALDI is distinct from some other methods of ionisation. The mass-independent velocity (and hence mass dependent initial kinetic energy) allows ion bunching techniques including time lag focusing (also known as pulsed extraction) to be used to give advantageously sharp common time-foci and spatial focus for a range of ion masses (specifically m/z's).

The invention includes spatial focusing of the ion beam at a focal point at the entrance of an ion mirror, concomitant with time focusing. The time-focus may be in a fringing field of the mirror or even inside the mirror, depending upon the nature of a fringing field. A detector placed at this common position of time and space focusing records a time-of-flight spectrum with high resolution.

A distinguishing feature of the invention is that the time and space focus is not destroyed by fragmentation in field-free regions between source and ion mirror. The fragmentation is the result of energisation of the parent ions by collisions in the source, in the dense plume at and above the sample surface in the case of MALDI, and/or along the flight path from source to ion mirror. Preferably fragment ions are mass analysed by the ion mirror. Suitably, fragment ions are formed by decomposition of parent ions in a free-field region between the ion source and the ion mirror and are mass analysed by the ion mirror. Because of the masses of the parent ions (typically in the range $10^2$–$10^4$ Da) and because of the conditions (dissociation in field-free regions), translational energy release in fragmentations of the ions are not large (≦100 meV), and the perturbation of the velocity of the dissociating system is not significant. The mean velocity of a given fragment will be identical or very close to that of its parent ion. The directional characteristics of a parent ion will be retained by its fragments because of the small energy releases and large fragment masses. Thus the space-focussing and time-focussing characteristics of a parent ion will be retained by its fragments, when fragmentation takes place in the field-free region between source and ion mirror. Sharp space-focus and time-foci are achieved for all parent ions and for all fragment ions with all of the envisaged ion optical arrangements. Fragment ions from a given parent ion share the same space-focus and time-focus as their parent ion. Different parent ions share the same space-focus but possess different time-foci depending upon their mass-to-charge ratios.

The concomitant space-focussing and time-focussing may be achieved through pulsed electric potentials applied in the ion source either prior to fill acceleration or as an integral part of acceleration, after extraction from the ion source, in a region between the source and the focal point or any combination thereof. Suitably the means for compressing or bunching ions improves the quality of time-foci and space focus and the quality of the time and energy focal surface of the ion mirror. A variation within the common method involves orthogonal extraction of the ion beam with the spatial and time-focussing being achieved during or subsequent to the orthogonal extraction. This latter approach is well suited to ESI sources affording a continuous stream of ions. A device can be used to impart movement in the orthogonal direction. The time focusing and space focusing are enhanced by pulsed orthogonal extraction.

According to another aspect of the invention there is provided apparatus for the structural characterisation of molecules by time-of-flight mass spectrometry, the apparatus comprising an ion source, and means to deflect ions from the source orthogonally into a flight path leading to a detector.

Preferably the orthogonal deflecting means is arranged to operate in a pulsed manner to deflect discrete groups of ions orthogonally.

Fragmentation may be arranged to occur subsequent to orthogonal deflection.

The ion mirror has a quadratic or substantially quadratic field and a surface of time focus. The time and space focal point at the entrance of the ion mirror is the object of the mirror, the image of which falls at the surface of time focus. This time focus surface is common to parent ions and all fragments formed therefrom, being independent of ion energy. A large area detector is located at this surface. A given parent ion and fragment ions thereof are separated in time and each individually focused at its characteristic reflection time, because the characteristics of the ion mirror compensate for the different mean translation energies resulting from partition of energy in the case of fragmentation and for the translation energy spreads of individual ions resulting from the, in some cases, multiple steps of ion bunching and from the dissociation dynamics in the case of fragmentation.

The ion mirror may be created from solid electrodes, from stacks of electrode-plates which may have apertures of circular, or preferably ellipsoidal or other oval cross-sections or from semi-conducting boards with inset metal strips to create equipotentials. The last of these lends itself to setting up two-dimensional quadratic fields without fields in the third dimension.

A detector may be provided at the first time-focusing position, or elsewhere between the ion source and substantially quadratic field ion mirror to detect a first time of flight mass spectrum and this information may be analysed together with information from the said large area detector. This can provide mass calibration and improved mass accuracy. The principle of measurement of two flight times for a specific m/z may be extended to a tandem TOF instrument employing an ion mirror as the first time of flight means to provide tie first TOF spectrum.

According to a further aspect of the invention there is provided apparatus for the structural characterisation of molecules by time of flight mass spectrometry, the apparatus including an ion source, an ion mirror and two detectors, the first detector being between the ion source and ion mirror and being arranged to detect a first time of flight mass spectrum. and the second detector being located after the ion mirror to detect a second time of flight mass spectrum.

Preferably means for compressing or bunching the ions from the ion source is provided between the ion source and the first detector.

Parent ions can be fragmented to obtain structural information. Fragmentation may be introduced by raising the laser flounce above the threshold for ion formation by MALDI and/or by controlling the pressure in the whole region (or part thereof) between the source and the entrance to the ion mirror. Pressure is controlled by the balance between the pumping speed of the vacuum pumps employed to remove gas from the region (or part thereof) and the rate at which gas enters the region (or part thereof) by outgassing and/or introduction of collision gas. The invention does not necessitate or assume either introduction of collision gas or the use of a collision cell. With an ESI source, fragmentation either immediate or delayed may be introduced by by control of potentials (nozzle, skimmer) in the source. Preferably, the apparatus includes means to assist or induce decomposition by energisation resulting from laser irradiation during desorption or by photo dissociation in the field free dissociation region.

The chemical nature, including the rate, of the fragmentation may be influenced and/or controlled through chemical modification of the peptide, protein, polymer or other sample prior to introduction into the ion source of the mass spectrometer. The chemical nature, including the rate, of the fragmentation may be influenced and/or controlled through chemical interaction with the peptide, protein, polymer or other sample within the ion source of the mass spectrometer.

Fragment ions of the same parent ion precursor have a fraction of the kinetic energy of the parent ion with heavier fragments having higher kinetic energy than the light fragments. The depth of penetration of various ions into the field is proportional to their kinetic energy and as a consequence fragment ions might not penetrate deep enough into the field in order to be deflected by the combination of curvature of the field, deflection plates and angular inclination of the mirror and reach the detector.

According to another aspect of the invention there is provided mass spectrometry apparatus, the apparatus comprising a serial arrangement of an ion source, first time of flight means, a field free region, means to fragment the charged molecules, a second time of flight means and a large area detector, wherein the second time of flight means includes an ion mirror, the ion mirror being arranged to produce a reflecting substantially quadratic field, the first time of flight means is arranged to provide spatial focusing concomitant with time focusing of ions at or near the entrance to the ion mirror, the means to fragment the charged molecules being provided as a collision cell or in the field free region or in the first time of flight means, the means to fragment the charged molecules having a potential which is different from the potential at the entrance to the ion mirror, and the detecting surface of the detector being mounted in the time focal surface of the ion mirror.

The means to fragment the charged molecules includes a collision cell in one embodiment. The apparatus preferably then includes means to extract the ions formed in the collision cell. In an alternative embodiment, the means to fragment the charged molecules may be in the first time of flight means.

The entrance to the ion mirror is preferably at a different potential from ground potential.

The second time of flight means is preferably at an angle to the ion optical axis of the first time of flight means.

Means may be provided to extract ions orthogonally into the first time of flight means.

Means is preferably provided to pulse the gas to induce fragmentation.

In one embodiment, an ion mobility mass spectrometer is provided in advance of the first time of flight means.

A distinguishing feature of the invention is that the dissociation region in the form of a collision cell or the whole field free region can be at a different potential from the front of the mirror, thus allowing the fragments to penetrate deeper into the field and be effectively collected.

Embodiments of the invention will now be described by way of example and with reference to the accompanying drawings, in-which:

Figure 1:
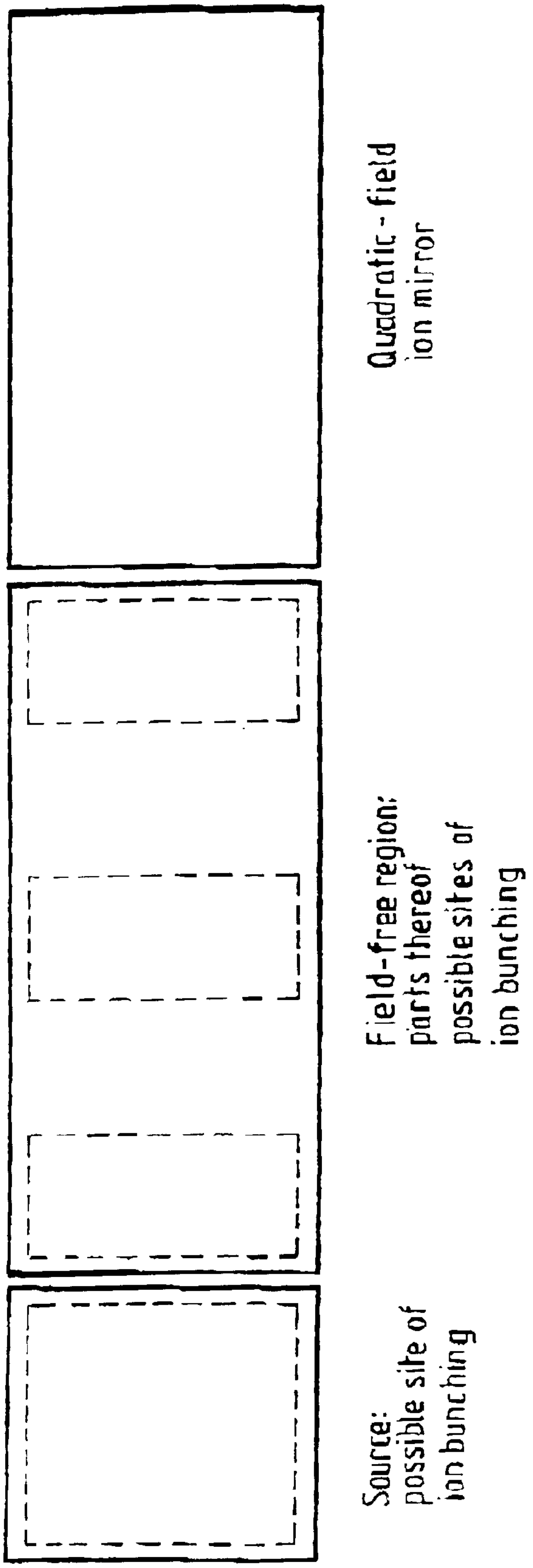
FIG. 1 is a schematic drawing of tandem mass spectrometry apparatus according to the first embodiment of the invention.
Figure 2:
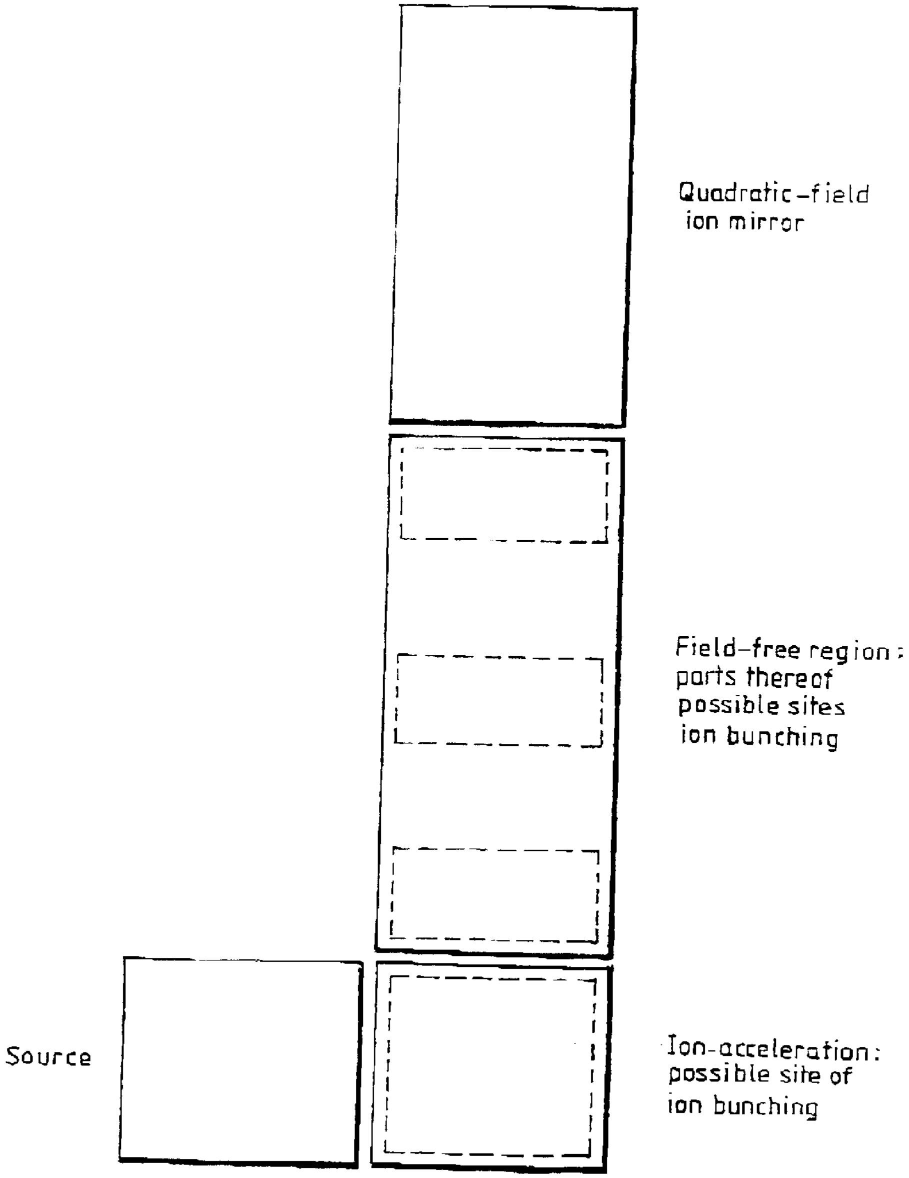
FIG. 2 is a schematic drawing of tandem mass spectrometry apparatus according to the second embodiment of the invention.
Figure 4:
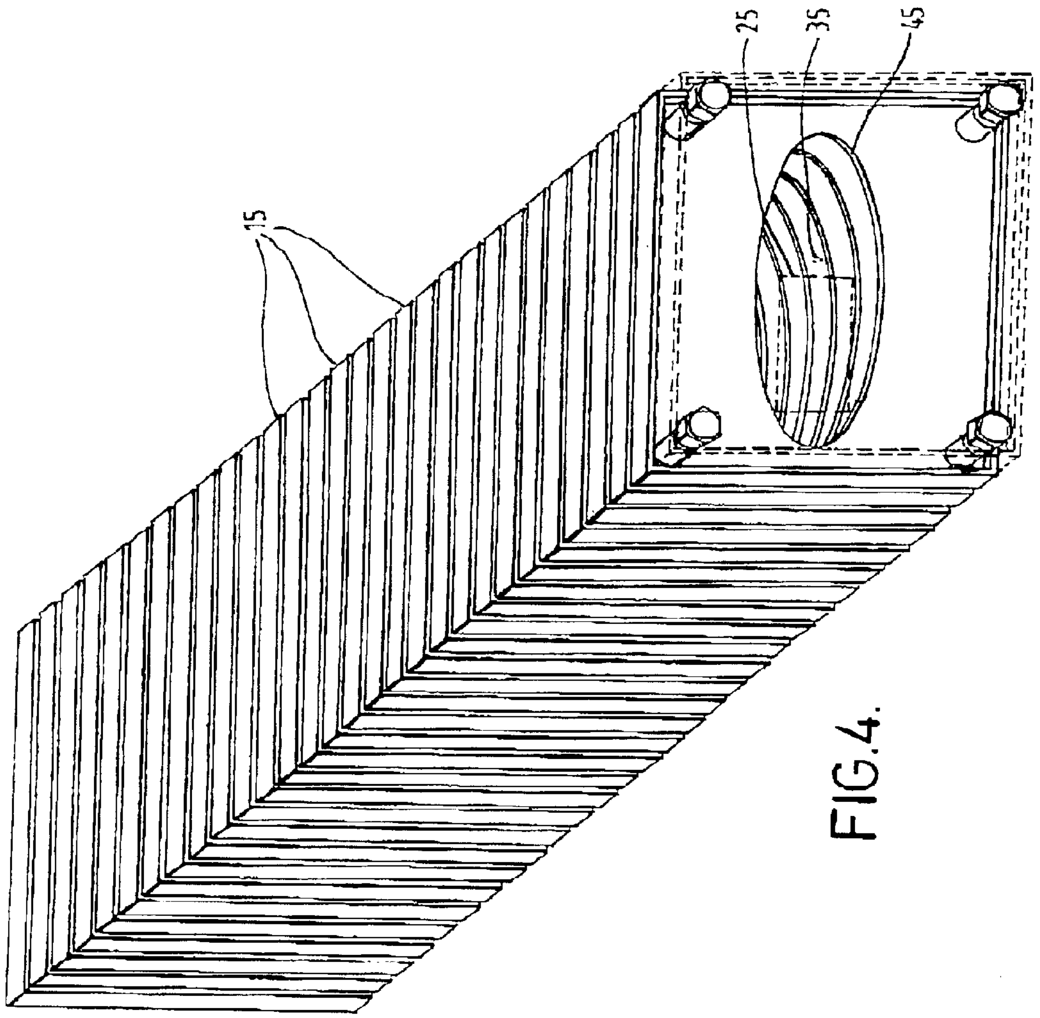
Figure 5:
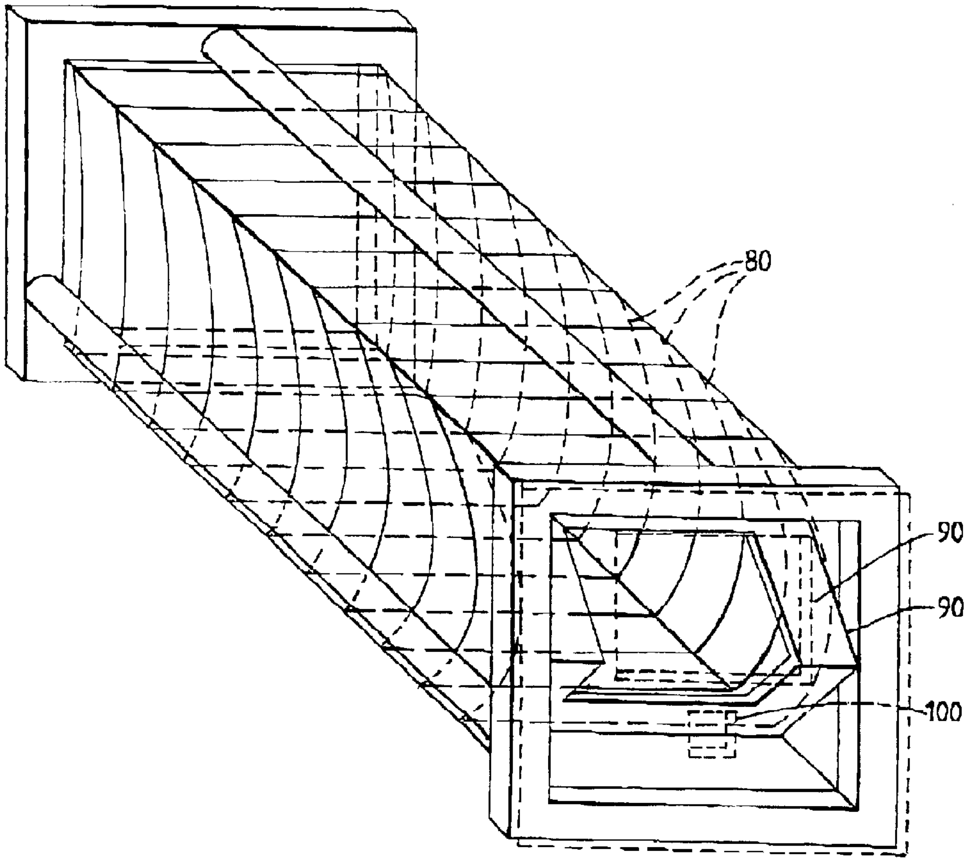
Figure 6:
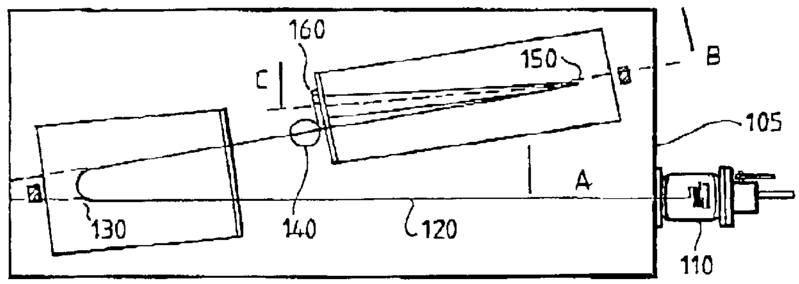
Figure 7A:
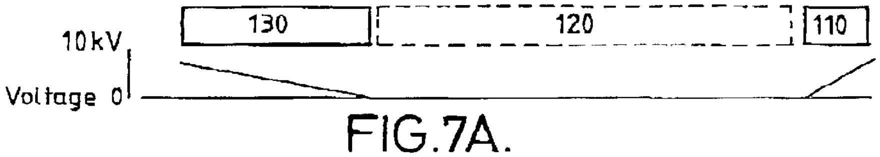
Figure 7B:
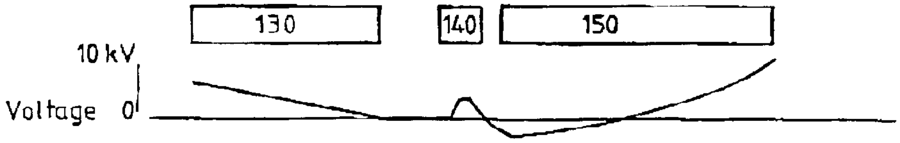
Figure 7C:
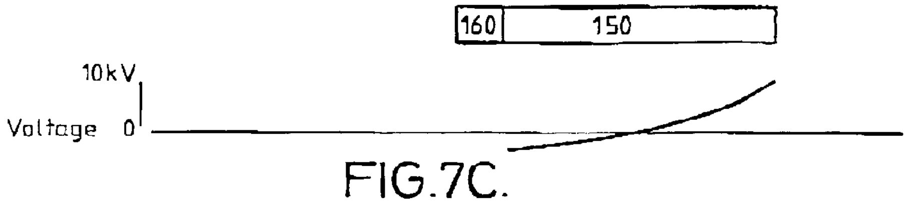
Figure 8:
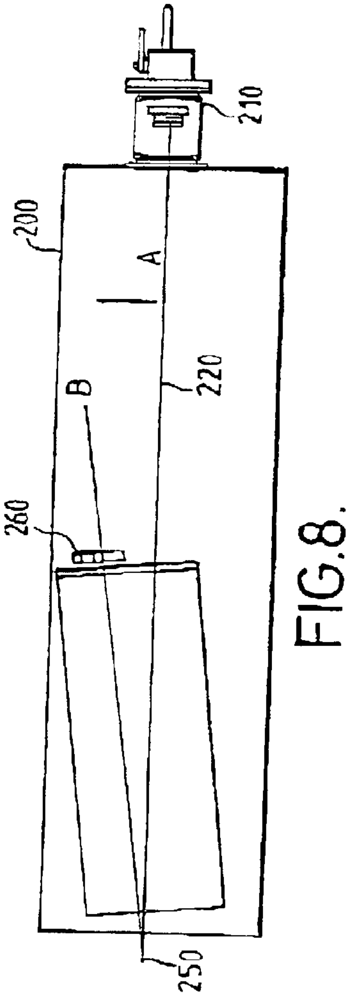
Figure 9A:
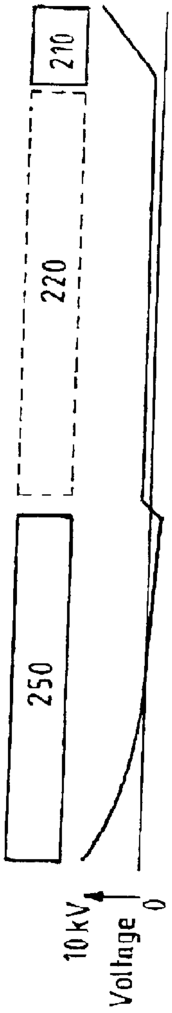
Figure 9B:
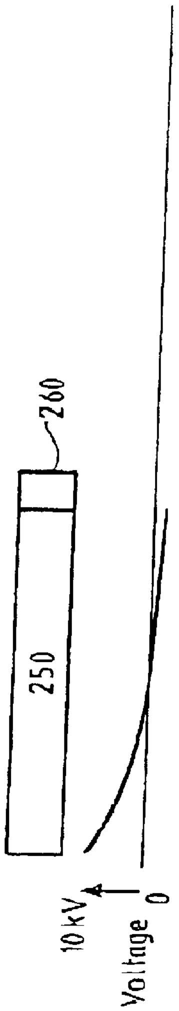
Figure 10:
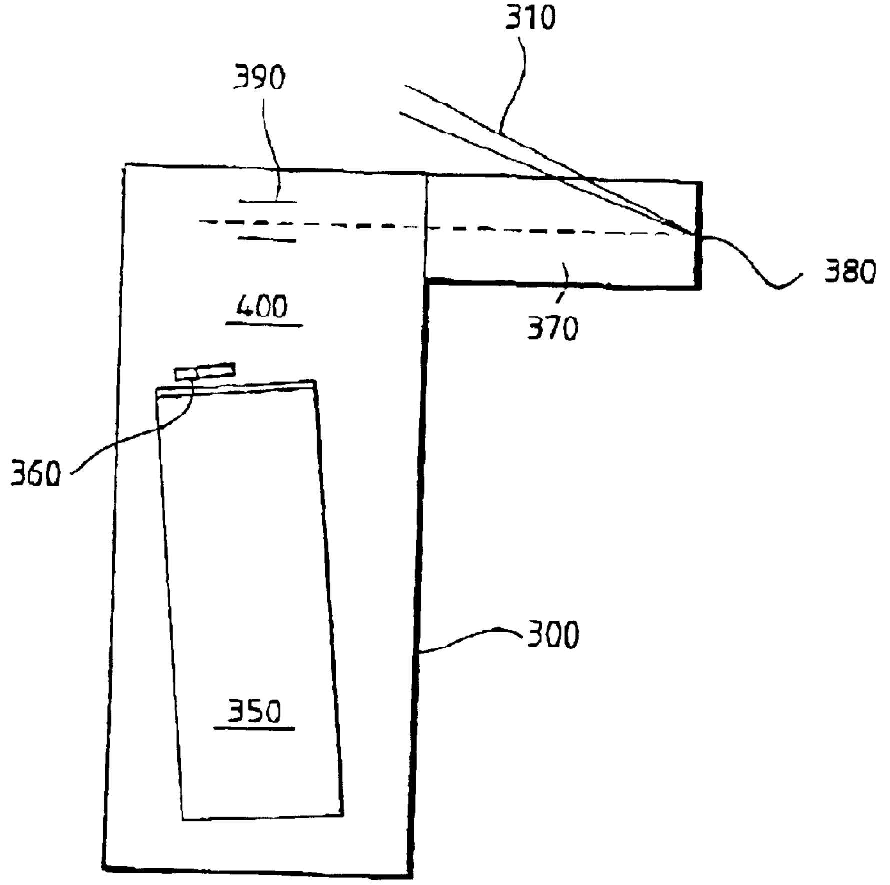

FIG. 4 a further practical embodiment according to either FIG. 1 or FIG. 2;

FIG. 5 is a further practical embodiment according to either FIG. 1 or FIG. 2;

FIG. 6 is a schematic plan view of tandem mass spectrometry apparatus in another embodiment of the invention;

FIGS. 7A, B and C are diagrams of the potential through the apparatus of the embodiment of FIG. 6;

FIG. 8 is a schematic plan view of tandem mass spectrometry apparatus in a further embodiment of the invention;

FIGS. 9A and B are diagrams of the potential through the apparatus of the embodiment of FIG. 8; and, FIG. 10 is a schematic plan view of tandem mass spectrometry apparatus in another embodiment of the invention.

FIG. 1 shows in simple terms the basic layout of time-of-flight mass spectrometry apparatus of the first embodiment of the invention. A first box represents the ion source, which is a possible site of ion bunching. There then follows a field-free region and ion bunching can take place at a site at any position along the field-free region. The field-free region leads to the quadratic-field ion mirror.

In FIG. 2, a further stage is introduced between the ion source and the field free region which is an orthogonal ion accelerator. Ion bunching can also take place at this site.

Figure 3:
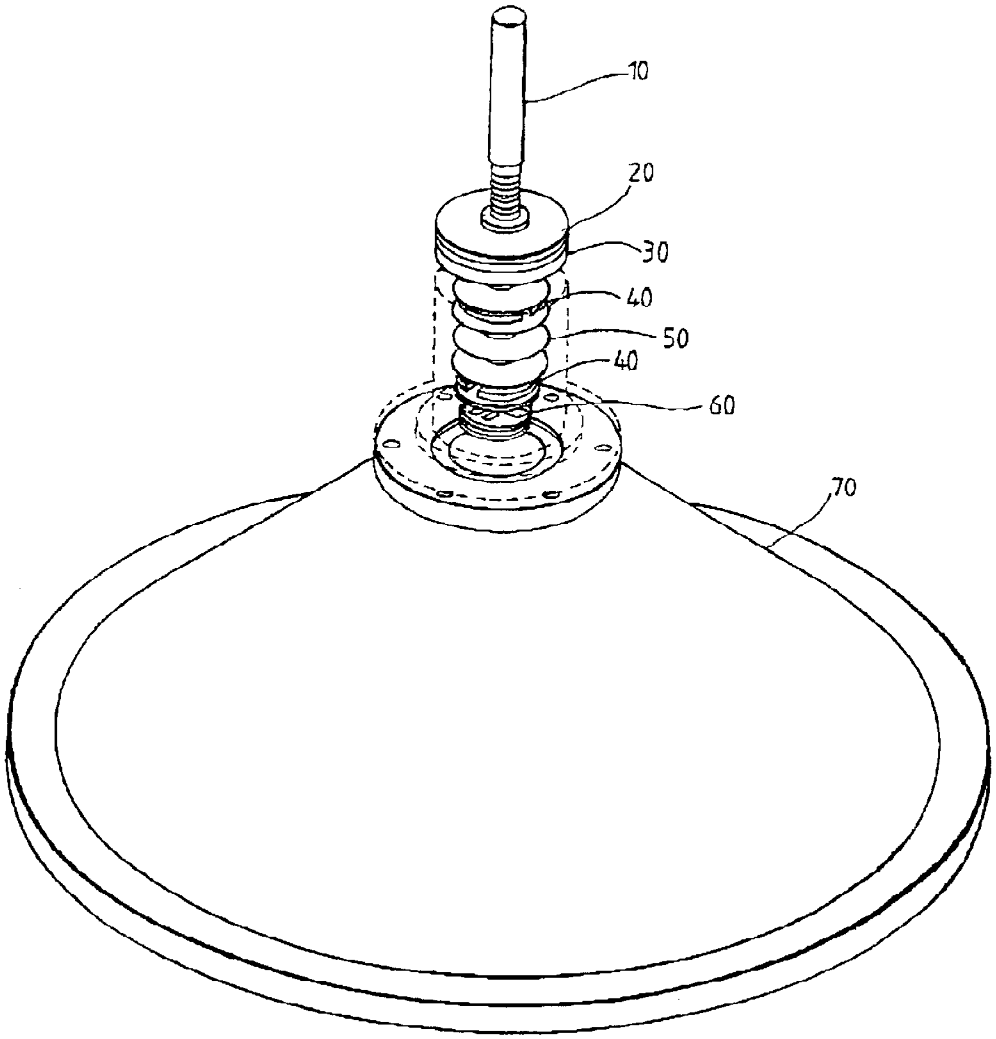
FIG. 3 is a practical embodiment according to FIG. 1.

In the embodiment of FIG. 3 an ion source of the MALDI type 10 leads through a buncher 20 to focusing and deflecting electrodes 30 and subsequently to an ion mirror 70, through a large area detector 60. The elements 20, 30, 40, and 50 take the form of apertured discs while part of the ion mirror 70 takes the form of a regular cone. It thus consists of a 500 mm diameter hyperboloidal electrode mounted coaxially on electrical isolators inside a conical electrode such that the spacing between the top of the hyperbola and apex of the conc is 160 mm.

FIG. 4 shows an alternative embodiment in which a substantially quadratic-field is created from a series of parallel electrode plates 45 and 15 lying in planes perpendicular to the optical axis, the plates including elliptical apertures enabling the ion stream to pass through one focus of the ellipse and return through the other focus with entry point 35 and large area detector 25. The electrode plates 45, 15 are mounted on electrical isolators. The electrodes 15, 45 have elliptical apertures with 210 mm major axis and 70 mm minor axis. Each electrode 15, 45 is 200 mm wide and 250 mm high and fitted with field stops to prevent field penetration between electrodes. The first and last electrodes 45 form field terminators.

The embodiment of FIG. 5 is similar to that of FIG. 4 except that the apertured electrode plates are replaced by semiconducting boards 80 with inset metal strips to create equi-potentials. Each semiconducting board 80 is formed into a square of 150 mm sides and supported on a framework consisting of two end plates connected with longitudinal bars of 600 mm length. Conducting strips etched onto the semiconducting boards 80 form the internal electrode structure with conventional solid electrodes providing termination of the field at each end. The detector 90 is shown in this figure and entry point 100.

The ion buncher in the source in each embodiment in FIG. 1 or FIG. 2 may operate in accordance with the principles of "Wiley-McClaren" focusing.

The orthogonal ion accelerator of FIG. 2 may take the form of two parallel plates acting in a similar manner to the ion mirror to deflect and accelerate incoming ions.

Referring to FIG. 6 of the drawings, the tandem mass spectrometer 105 of this embodiment comprises a serial arrangement of a pulsed ion source or a delayed extraction ion source 110, a field free region 120, which together with the first ion mirror 130 constitutes the aforesaid "first time of flight means", a collision region 140 which can be raised to a voltage different from the field free region 120, means to apply an extraction potential, a substantially quadratic field ion mirror 150 and a detector 160. The front of the mirror 150 can be held at a potential different from the field free region 120 and means is provided to adjust the angle of inclination of the mirror 150 in conventional fashion. Voltage diagrams 7A, B and C show the possible voltage distribution across the ion path.

Referring to FIG. 8 of the drawings, the tandem mass spectrometer 200 of this embodiment comprises a serial arrangement of a pulsed ion source or a delayed extraction ion source 210, a field free region 220, which constitutes the aforesaid "first time of flight means", and where the fragmentation of the ions takes place without the need for a collision cell. a substantially quadratic field ion mirror 250 and a detector 260. The front of the mirror 250 can be held at a potential different from the field free region 220 and means is provided to adjust the angle of inclination of the mirror 250 in conventional fashion. Voltage diagrams 9A and B show the possible voltage distribution across the ion path.

Referring to FIG. 10 the tandem mass spectrometer 300 of this embodiment comprises an ion mobility mass spectrometer 370 operating at atmospheric or near atmospheric pressure, means to generate ions 310, sample 380, orthogonal extraction plates 390 that provide the temporal and spatial focal point for the operation of the substantially quadratic field ion mirror 350, which the ions reach through a vacuum chamber 400, means to adjust the angle of inclination of the mirror 350 and a detector 360. With this device ions are generated within the ion mobility mass spectrometer 370 at atmospheric or near atmospheric pressure and analysed by the substantially quadratic field ion mirror 350.

What is claimed is:

1. Mass spectrometry apparatus, the apparatus comprising:

a serial arrangement of an ion source for charged molecules, first time of flight means, a field free region, means to fragment the charged molecules, a second time of flight means, and a large area detector, wherein the second time of flight means includes an ion mirror, the ion mirror being arranged to produce a reflecting substantially quadratic field, the first time of flight means is arranged to provide spatial focusing concomitant with time focusing of ions at or near the entrance to the ion mirror, the means to fragment the molecules is provided as a collision cell or in the field free region or in the first time of flight means, the means to fragment the charged molecules having a potential which is different from the potential at the entrance to the ion mirror, and the detecting surface of the detector being mounted in the time focal surface of the ion mirror, and further including means for compressing or bunching ions to improve the quality of time-foci space foci and the quality of the time and energy focal surface of the ion mirror.

2. An apparatus as claimed in claim 1, wherein the means to fragment the molecules includes a collision cell.

3. An apparatus as claimed in claim 2, wherein the apparatus includes means to extract the ions formed in the collision cell.

4. An apparatus as claimed in claim 1, wherein the means to fragment the molecules is in the first time of flight means.

5. An apparatus as claimed in claim 1, wherein the potential at the entrance to the ion mirror is different from ground potential.

6. An apparatus as claimed in claim 1, wherein the second time of flight means is at an angle to the ion optical axis of the first time of flight means.

7. An apparatus as claimed in claim 1, wherein means is provided to extract ions orthogonally into the first time of flight means.

8. An apparatus as claimed in claim 1, wherein means is provided to pulse the charged molecules to induce fragmentation.

9. A mass spectrometry apparatus, the apparatus comprising:

a serial arrangement of an ion source for charged molecules, first time of flight means, a field free region, means to fragment the charged molecules, a second time of flight means, and a large area detector, and an ion mobility mass spectrometer provided in advance of the first time of flight means, wherein the second time of flight means includes an ion mirror, the ion mirror being arranged to produce a reflecting substantially quadratic field, the first time of flight means is arranged to provide spatial focusing concomitant with time focusing of ions at or near the entrance to the ion mirror, the means to fragment the molecules is provided as a collision cell or in the field free region or in the first time of flight means, the means to fragment the charged molecules having a potential which is different from the potential at the entrance to the ion mirror, and the detecting surface of the detector being mounted in the time focal surface of the ion mirror.

10. An apparatus as claimed in claim 1, wherein the ion mirror is arranged to produce a parabolic field along the ion optical axis of the apparatus.

11. An apparatus as claimed in claim 1, wherein the ion source comprises means for ionisation of the sample by matrix-assisted laser disportion/ionisation (MALDI).

12. An apparatus as claimed in claim 1, wherein fragment ions formed by decomposition of parent ions in a free field region between the ion source and the ion mirror are mass analysed by the aforesaid ion mirror.

13. An apparatus as claimed in claim 12, wherein the apparatus includes means to assist or induce decomposition by energisation resulting from laser irradiation during disportion or by photo dissociation in the field free dissociation region.

14. An apparatus as claimed in claim 1, wherein the apparatus includes means to accelerate parent ions orthogonally to give the time foci added space focus and fragmentation occurs subsequent to this acceleration.

15. An apparatus as claimed in claim 1, wherein a detector is provided between the ion source and the ion mirror to detect a first time of flight mass spectrum and this information is analysed by analysis from the said large area detector.

16. An apparatus for the structural characterisation of molecules by time of flight mass spectrometry, the apparatus including an ion source, an ion mirror and two detectors, the first detector being between the ion source and ion mirror and being arranged to detect a first time of flight mass spectrum, and the second detector being located after the ion mirror to detect a second time of flight mass spectrum.

17. An apparatus as claimed in claim 16, wherein means for compressing or bunching the ions from the ion source is provided between the ion source and the first detector.

18. An apparatus as claimed in claim 1 for the structural characterisation of molecules by time-of-flight mass spectrometry, the apparatus further comprising means to deflect ions from the source orthogonally into a flight path leading to the detector.

19. An apparatus as claimed in claim 18, wherein the orthogonal deflecting means is arranged to operate in a pulsed manner to deflect discrete groups of ions orthogonally.

20. An apparatus as claimed in claim 18, wherein fragmentation is arranged to occur subsequent to orthogonal deflection.

* * * * *